(12) United States Patent
Schrempp et al.

(10) Patent No.: US 8,755,192 B1
(45) Date of Patent: Jun. 17, 2014

(54) RACK-MOUNTED COMPUTER SYSTEM WITH SHOCK-ABSORBING CHASSIS

(75) Inventors: Michael W. Schrempp, Bainbridge Island, WA (US); Matthew T. Corddry, Seattle, WA (US); Darin Lee Frink, Lake Tapps, WA (US); Peter G. Ross, Olympia, WA (US); Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 107 days.

(21) Appl. No.: 12/751,206

(22) Filed: Mar. 31, 2010

(51) Int. Cl.
*H05K 1/14* (2006.01)
*G06F 1/20* (2006.01)
*H05K 5/00* (2006.01)
*H05K 7/20* (2006.01)

(52) U.S. Cl.
USPC ............... 361/736; 361/679.5; 361/752

(58) Field of Classification Search
USPC ............ 361/724–732, 736, 748, 752–753, 361/679.5, 690
See application file for complete search history.

(56) References Cited

U.S. PATENT DOCUMENTS

| | | |
|---|---|---|
| 3,481,485 A | 12/1969 | Hess |
| 3,807,572 A | 4/1974 | Luvara et al. |
| 3,834,423 A | 9/1974 | Elson |
| 3,915,477 A | 10/1975 | Timmons |
| 4,082,092 A | 4/1978 | Foster |
| 4,328,897 A | 5/1982 | Weiss |
| 4,448,111 A | 5/1984 | Doherty |
| 4,585,122 A * | 4/1986 | Stegenga ............... 361/748 |
| 4,864,469 A * | 9/1989 | Boudon ............... 361/679.43 |
| 4,926,291 A * | 5/1990 | Sarraf ............... 361/679.36 |
| 5,208,722 A | 5/1993 | Ryan et al. |
| 5,294,049 A | 3/1994 | Trunkle et al. |
| 5,412,534 A * | 5/1995 | Cutts et al. ............... 361/695 |
| 5,473,507 A * | 12/1995 | Schwegler et al. ......... 361/690 |
| 5,506,750 A | 4/1996 | Carteau et al. |
| 5,518,277 A | 5/1996 | Sanders |
| 5,621,890 A | 4/1997 | Notarianni et al. |
| 5,644,472 A * | 7/1997 | Klein ............... 361/695 |
| 5,682,289 A * | 10/1997 | Schwegler et al. ...... 361/679.33 |
| 5,751,549 A * | 5/1998 | Eberhardt et al. ....... 361/679.33 |
| 5,772,500 A | 6/1998 | Harvey et al. |

(Continued)

FOREIGN PATENT DOCUMENTS

EP    0 546 211    6/1993
EP    0 741 269    11/1996

(Continued)

OTHER PUBLICATIONS

U.S. Appl. No. 11/535,180, filed Sep. 26, 2006, Osvaldo Patricio Morales.

(Continued)

*Primary Examiner* — Adrian S Wilson
(74) *Attorney, Agent, or Firm* — Robert C. Kowert; Meyertons, Hood, Kivlin, Kowert & Goetzel, P.C.

(57) ABSTRACT

A system includes a rack and one or more computer systems mounted in the rack. At least one of the computer systems includes a circuit board assembly, such as a motherboard, and a chassis coupled to the circuit board assembly. At least a portion of the chassis is made of a shock-absorbing polymeric material, such as an expanded foam material.

40 Claims, 10 Drawing Sheets

(56) References Cited

U.S. PATENT DOCUMENTS

| | | | |
|---|---|---|---|
| 5,796,580 A | 8/1998 | Komatsu et al. | |
| 5,806,438 A | 9/1998 | Beaudet | |
| 5,822,184 A | 10/1998 | Rabinovitz | |
| 5,843,131 A | 12/1998 | McDonough | |
| 5,871,396 A | 2/1999 | Shen | |
| 6,031,717 A * | 2/2000 | Baddour et al. | 361/679.49 |
| 6,039,190 A | 3/2000 | Clausen | |
| 6,141,986 A | 11/2000 | Koplin | |
| 6,166,917 A * | 12/2000 | Anderson | 361/756 |
| 6,259,605 B1 | 7/2001 | Schmitt | |
| 6,364,009 B1 | 4/2002 | Macmanus et al. | |
| 6,425,417 B1 | 7/2002 | Paschke | |
| 6,456,498 B1 * | 9/2002 | Larson et al. | 361/752 |
| 6,459,579 B1 | 10/2002 | Farmer et al. | |
| 6,469,899 B2 | 10/2002 | Hastings et al. | |
| 6,496,366 B1 | 12/2002 | Coglitore et al. | |
| 6,499,609 B2 | 12/2002 | Patriche et al. | |
| 6,525,936 B2 | 2/2003 | Beitelmal et al. | |
| 6,563,704 B2 | 5/2003 | Grouell et al. | |
| 6,590,768 B1 | 7/2003 | Wiley | |
| 6,603,661 B2 | 8/2003 | Smith et al. | |
| 6,621,693 B1 | 9/2003 | Potter et al. | |
| 6,625,020 B1 | 9/2003 | Hanson et al. | |
| 6,650,535 B1 * | 11/2003 | Moss et al. | 361/679.33 |
| 6,754,082 B1 | 6/2004 | Ding et al. | |
| 6,767,280 B1 | 7/2004 | Berger | |
| 6,791,836 B2 | 9/2004 | Cipolla et al. | |
| 6,795,314 B1 * | 9/2004 | Arbogast et al. | 361/695 |
| 6,804,123 B1 * | 10/2004 | Cheng | 361/784 |
| 6,819,567 B2 * | 11/2004 | Baker et al. | 361/724 |
| 6,833,995 B1 | 12/2004 | Hsue et al. | |
| 6,859,366 B2 | 2/2005 | Fink | |
| 6,960,130 B2 | 11/2005 | Gebke et al. | |
| 7,003,966 B2 | 2/2006 | Sharma et al. | |
| 7,010,392 B2 | 3/2006 | Bash et al. | |
| 7,031,154 B2 | 4/2006 | Bash et al. | |
| 7,035,111 B1 | 4/2006 | Lin et al. | |
| 7,042,722 B2 | 5/2006 | Suzuki et al. | |
| 7,068,505 B2 * | 6/2006 | Kosugi | 361/690 |
| 7,112,131 B2 | 9/2006 | Rasmussen et al. | |
| 7,197,433 B2 | 3/2007 | Patel et al. | |
| 7,238,104 B1 | 7/2007 | Greenslade et al. | |
| 7,257,956 B2 | 8/2007 | Shimada et al. | |
| 7,272,001 B2 * | 9/2007 | Cheng | 361/679.48 |
| 7,278,273 B1 | 10/2007 | Whitted et al. | |
| 7,283,358 B2 | 10/2007 | Campbell et al. | |
| 7,346,913 B2 | 3/2008 | Ishimine et al. | |
| 7,361,081 B2 | 4/2008 | Beitelmal et al. | |
| 7,379,299 B2 | 5/2008 | Walsh et al. | |
| 7,403,385 B2 * | 7/2008 | Boone et al. | 361/692 |
| 7,408,775 B2 | 8/2008 | Walz et al. | |
| 7,434,413 B2 | 10/2008 | Wruck | |
| 7,486,505 B2 * | 2/2009 | Fushimi et al. | 361/679.08 |
| 7,499,286 B2 | 3/2009 | Berke et al. | |
| 7,500,911 B2 | 3/2009 | Johnson et al. | |
| 7,542,288 B2 | 6/2009 | Lanus | |
| 7,660,116 B2 | 2/2010 | Claassen et al. | |
| 7,660,117 B2 | 2/2010 | Werner et al. | |
| 7,701,710 B2 | 4/2010 | Tanaka et al. | |
| 7,733,666 B2 | 6/2010 | Ichihara et al. | |
| 7,746,634 B2 | 6/2010 | Hom et al. | |
| 7,764,498 B2 | 7/2010 | Conn | |
| 7,768,780 B2 | 8/2010 | Coglitore et al. | |
| 7,768,787 B2 | 8/2010 | Vaughan et al. | |
| 7,804,685 B2 | 9/2010 | Krietzman | |
| 7,821,790 B2 * | 10/2010 | Sharma et al. | 361/727 |
| 7,843,685 B2 * | 11/2010 | Beauchamp et al. | 361/679.49 |
| 7,869,210 B2 | 1/2011 | Moss | |
| 7,878,888 B2 | 2/2011 | Rasmussen et al. | |
| 7,929,300 B1 | 4/2011 | Bisbikis et al. | |
| 7,944,700 B2 | 5/2011 | Wang et al. | |
| 7,990,700 B2 | 8/2011 | Guo | |
| 8,087,979 B2 | 1/2012 | Rasmussen | |
| 8,154,870 B1 | 4/2012 | Czamara et al. | |
| 2001/0029163 A1 | 10/2001 | Spinazzola et al. | |
| 2002/0021557 A1 | 2/2002 | Ishimine et al. | |
| 2002/0100736 A1 | 8/2002 | Lopez | |
| 2002/0134531 A1 | 9/2002 | Yanagida | |
| 2002/0181194 A1 | 12/2002 | Ho et al. | |
| 2003/0156385 A1 * | 8/2003 | Askeland et al. | 361/687 |
| 2004/0020224 A1 | 2/2004 | Bash et al. | |
| 2004/0032722 A1 | 2/2004 | Wrycraft et al. | |
| 2004/0165349 A1 | 8/2004 | Arbogast et al. | |
| 2004/0218355 A1 | 11/2004 | Bash et al. | |
| 2005/0135069 A1 * | 6/2005 | King et al. | 361/727 |
| 2005/0166860 A1 | 8/2005 | Austin et al. | |
| 2005/0188689 A1 | 9/2005 | Juby et al. | |
| 2005/0228618 A1 | 10/2005 | Patel et al. | |
| 2005/0237716 A1 | 10/2005 | Chu et al. | |
| 2005/0257232 A1 | 11/2005 | Hidaka | |
| 2005/0265004 A1 | 12/2005 | Coglitore et al. | |
| 2005/0281014 A1 * | 12/2005 | Carullo et al. | 361/796 |
| 2006/0059937 A1 | 3/2006 | Perkins et al. | |
| 2006/0061955 A1 | 3/2006 | Imblum | |
| 2006/0250766 A1 | 11/2006 | Blaalid et al. | |
| 2006/0274496 A1 | 12/2006 | Lee et al. | |
| 2006/0290245 A1 | 12/2006 | Hidaka | |
| 2007/0053169 A1 * | 3/2007 | Carlson et al. | 361/727 |
| 2007/0058336 A1 * | 3/2007 | Cheng | 361/687 |
| 2007/0074525 A1 | 4/2007 | Vinson et al. | |
| 2007/0076369 A1 * | 4/2007 | Chen et al. | 361/687 |
| 2007/0101746 A1 | 5/2007 | Schlom et al. | |
| 2007/0159790 A1 * | 7/2007 | Coglitore et al. | 361/687 |
| 2007/0213000 A1 | 9/2007 | Day | |
| 2007/0217172 A1 * | 9/2007 | Bisbikis et al. | 361/753 |
| 2007/0223200 A1 * | 9/2007 | Fujiya et al. | 361/727 |
| 2007/0240433 A1 | 10/2007 | Manole | |
| 2008/0013275 A1 | 1/2008 | Beckley et al. | |
| 2008/0029250 A1 | 2/2008 | Carlson et al. | |
| 2008/0037209 A1 * | 2/2008 | Niazi et al. | 361/683 |
| 2008/0043427 A1 | 2/2008 | Lee et al. | |
| 2008/0055846 A1 | 3/2008 | Clidaras et al. | |
| 2008/0094797 A1 | 4/2008 | Coglitore et al. | |
| 2008/0112127 A1 | 5/2008 | June et al. | |
| 2008/0158813 A1 * | 7/2008 | Yin | 361/695 |
| 2008/0191590 A1 | 8/2008 | Lin et al. | |
| 2008/0232064 A1 | 9/2008 | Sato et al. | |
| 2008/0259566 A1 | 10/2008 | Fried | |
| 2008/0285232 A1 | 11/2008 | Claassen et al. | |
| 2008/0305733 A1 | 12/2008 | Noteboom et al. | |
| 2009/0061755 A1 | 3/2009 | Calder et al. | |
| 2009/0086441 A1 * | 4/2009 | Randall et al. | 361/724 |
| 2009/0097200 A1 * | 4/2009 | Sharma et al. | 361/688 |
| 2009/0109609 A1 | 4/2009 | Lai et al. | |
| 2009/0122505 A1 | 5/2009 | Lu | |
| 2009/0237877 A1 * | 9/2009 | Honda et al. | 361/679.39 |
| 2009/0257187 A1 * | 10/2009 | Mills et al. | 361/679.33 |
| 2009/0260384 A1 | 10/2009 | Champion et al. | |
| 2009/0296322 A1 | 12/2009 | Yang et al. | |
| 2009/0321105 A1 | 12/2009 | Sawyer | |
| 2010/0024445 A1 | 2/2010 | Cichanowicz | |
| 2010/0091458 A1 | 4/2010 | Mosier et al. | |
| 2010/0149754 A1 | 6/2010 | Chapel et al. | |
| 2010/0271766 A1 | 10/2010 | Lin | |
| 2011/0149508 A1 | 6/2011 | Malekmadani | |
| 2011/0239683 A1 | 10/2011 | Czamara et al. | |
| 2011/0284422 A1 | 11/2011 | Yamada | |
| 2012/0092811 A1 | 4/2012 | Chapel et al. | |

FOREIGN PATENT DOCUMENTS

| | | |
|---|---|---|
| EP | 2 053 911 | 4/2009 |
| EP | 2202751 | 6/2010 |
| JP | 2010-86450 | 4/2010 |
| WO | 98/34450 | 8/1998 |
| WO | 2008/143503 | 11/2008 |

OTHER PUBLICATIONS

U.S. Appl. No. 12/341,137, filed Dec. 28, 2008, Jonathan David Hay.
U.S. Appl. No. 11/956,849, filed Dec. 14, 2007, Osvaldo P. Morales.
U.S. Appl. No. 12/163,146, filed Jun. 27, 2008, Osvaldo P. Morales.
U.S. Appl. No. 13/103,860, filed May 9, 2011, Michael P. Czamara.
U.S. Appl. No. 12/646,417, filed Dec. 23, 2009, Michael P. Czamara.

(56) References Cited

OTHER PUBLICATIONS

U.S. Appl. No. 12/751,212, filed Mar. 31, 2010, Michael P. Czamara.
U.S. Appl. No. 12/886,440, filed Sep. 20, 2010, Peter G Ross et al.
U.S. Appl. No. 12/751,209, filed Mar. 31, 2010, Michael P. Czamara.
U.S. Appl. No. 12/886,469, filed Sep. 20, 2010, Peter G. Ross.
U.S. Appl. No. 12/886,437, filed Sep. 20, 2010, Peter G. Ross.
U.S. Appl. No. 12/886,472, filed Sep. 20, 2010, Peter G. Ross.

* cited by examiner

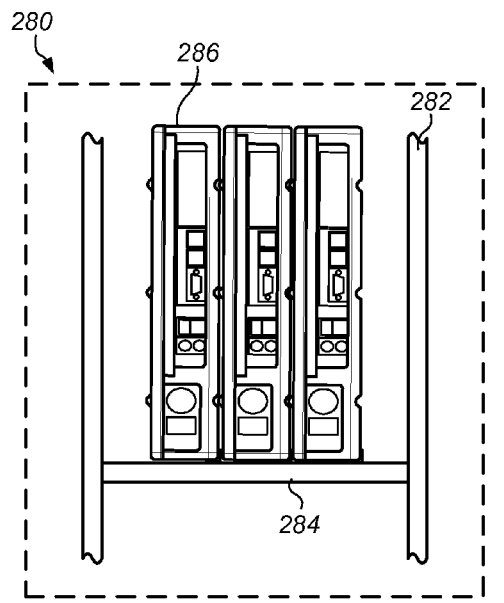
FIG. 11
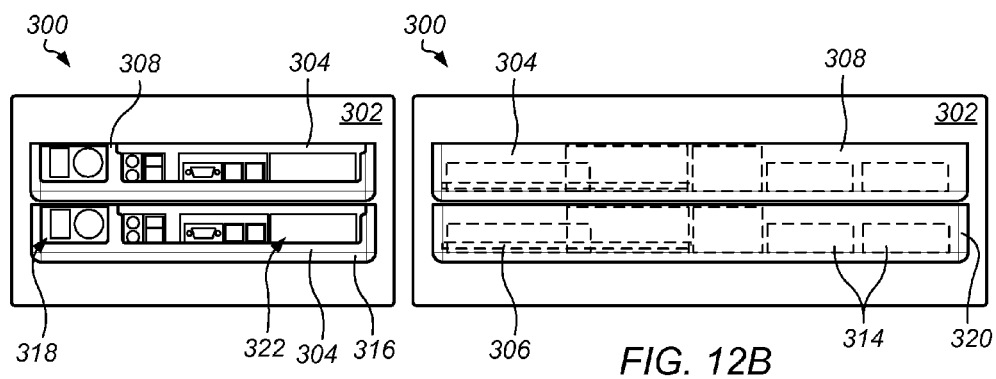
FIG. 12A
FIG. 12B
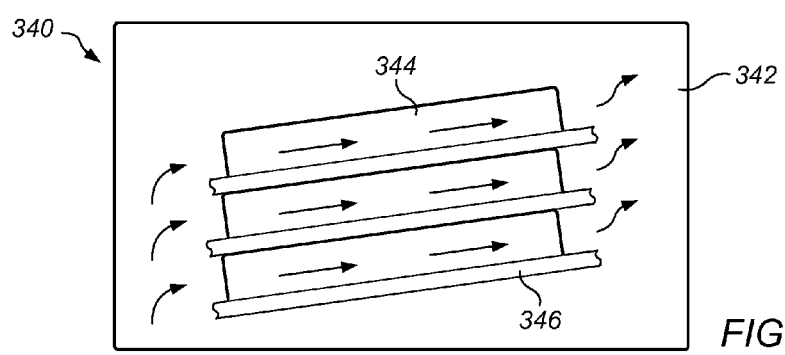
FIG. 13

RACK-MOUNTED COMPUTER SYSTEM WITH SHOCK-ABSORBING CHASSIS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

In many rack-mounted computer systems, circuit boards for the system are housed in a rack-mounted chassis. The chassis is commonly in the form of a box having metal panels on the front, back, sides, bottom, and top (the top often in the form of a removable lid). In addition to the main structural panels, such as chassis may have a many other parts such rails, fasteners, grills, and gaskets. Such a chassis may thus add significant cost and complexity to a computer system. Moreover, such a chassis may be heavy and consume a significant amount of space in the rack.

Computer systems to be installed in racks are commonly shipped in cardboard boxes filled with packing materials, such as polystyrene foam. The packing materials may protect a computer system from damage due to loads imposed during shipping, such as shock and vibration. After the computer system is removed from the box, such packing materials are typically discarded.

BRIEF DESCRIPTION OF THE DRAWINGS

FIG. 11 illustrates a portion of a rack system including computer systems with shock-absorbing chassis in which the computer systems are arranged in a vertical orientation.

FIG. 12A illustrates a schematic end view of a system including shock absorbing chassis forming an enclosure according to one embodiment. FIG. 12B illustrates a schematic side view of the system shown in FIG. 12A.

FIG. 13 illustrates a side view of a rack system that holds computer systems in a slanted orientation according to one embodiment.

Figure 1:
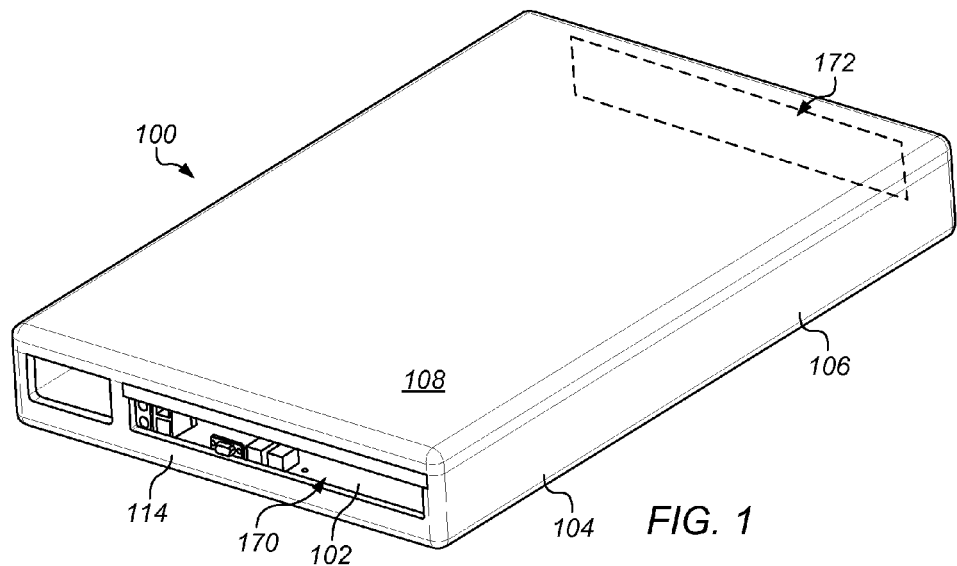
FIG. 1 illustrates an embodiment of a computer system including a circuit board assembly and a shock-absorbing chassis.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods using shock-absorbing chassis are disclosed. According to one embodiment, a system includes a rack and one or more computer systems mounted in the rack. At least one of the computer systems includes a circuit board assembly, such as a motherboard, and a chassis coupled to the circuit board assembly. At least a portion of the chassis is made of a shock-absorbing polymeric material, such as an expanded foam material. The shock-absorbing polymeric material protects the circuit board assembly from damage due to shock or vibration.

According to one embodiment, a computer system includes a first computer system module and at least one additional computer system module. The first computer system module includes a first chassis module and one or more circuit board assemblies coupled to the first chassis module. The one or more additional computer system modules include one or more additional chassis modules and at least one component coupled to at least one of the additional chassis modules. The additional chassis modules couple to the first chassis module. At least one of the chassis modules may be made of a shock-absorbing polymeric material, such as an expanded foam material.

According to one embodiment, a method of providing computing resources includes coupling one or more circuit board assemblies with one or more shock-absorbing chassis. The shock-absorbing chassis are at least partially made of a shock-absorbing material that protects the circuit board assemblies from damage from shock or vibration. The one or more circuit board assemblies are shipped, in the shock-absorbing chassis, to a data center. The circuit board assemblies are installed, in the shock-absorbing chassis, into a rack at the data center.

As used herein, "chassis" means a structure or element that supports another element or to which other elements can be mounted. A chassis may have any shape or construction, including a frame, a sheet, a plate, a box, a channel, or a combination thereof.

As used herein, a "rack" means a rack, container, frame, or other element or combination of elements that can contain or physically support one or more computer systems.

As used herein, a "polymeric material" means a material that is made at least primarily of a polymer. As used herein, a "polymer" means a naturally occurring or synthetic compound consisting of large molecules made up of a linked series of repeated simple monomers. Examples of polymers include polyolefins (such as polyethylene and polypropylene), polyurethanes, polyvinylchloride, and polyesters. A polymeric material may be expanded foam, such as expanded polypropylene. In some embodiments, a polymeric material is fire retardant. In some embodiments, a polymeric material may be electrically conductive, such as an electrically conductive expanded foam. In certain embodiments, a polymeric material may include an electrically conductive polymer.

As used herein, "shock absorbing", as applied to a supporting element for another element, means that the supporting element absorbs mechanical energy and/or dampens shock and/or vibration loads. A shock-absorbing material may be elastic, viscoelastic, viscous, or combinations thereof.

As used herein, an "interference fit" is a fit in which one coupling portion is slightly oversized relative to the coupling portion of a mating part into which it is at least partially received. For example, a pin having a diameter of 0.250 inches inserted into a hole having a diameter of 0.240 inches is an interference fit. As another example, a circuit board having a thickness of 0.125 inserted into a slot on a polystyrene foam packing tray having a width of 0.100 is an interference fit. In some interference fits, only a portion of a coupling element is oversized relative to the mating element. For example, in a pin having a "star" cross-section inserted in a round receiving hole, the tips of the points may lie in a diameter greater than the hole, but the vertices dividing the points may lie in a diameter that is less than the receiving hole.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computing operations are carried out. A data center may include servers dedicated to specific functions or serving multiple functions. Examples of computer operations include information processing, communications, testing, simulations, power distribution and control, and operational control.

As used herein, a "space" means a space, area or volume.

Figure 2:
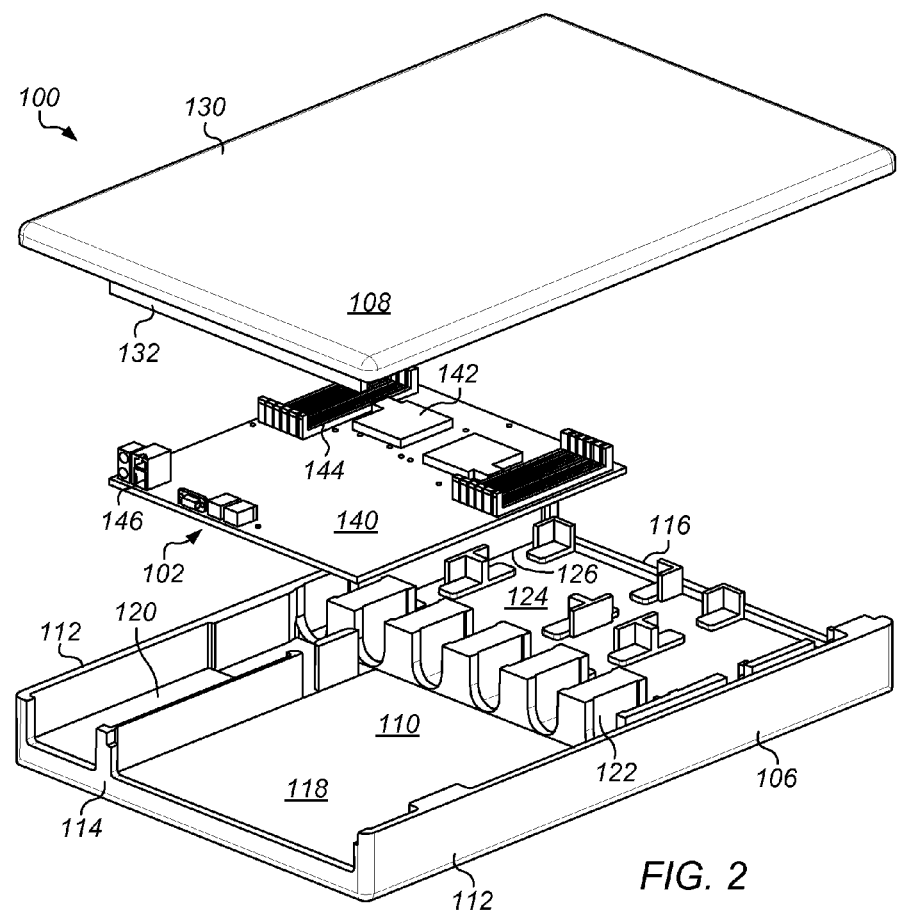
FIG. 2 is a partially exploded view of a computer system including a circuit board assembly and a shock-absorbing chassis.

In some embodiments, a computer system, such as a server, includes a chassis with shock-absorbing characteristics. FIG. 1 illustrates an embodiment of a computer system including a circuit board assembly and a shock-absorbing chassis. FIG. 2 is a partially exploded view of the computer system shown in FIG. 1. Computer system 100 includes circuit board assembly 102 and chassis 104. Circuit board assembly 102 is coupled to, and supported by, chassis 104.

Chassis 104 includes chassis base 106 and chassis lid 108. Chassis base 106 includes bottom panel 110, side panels 112, front panel 114, and rear panel 116. Chassis base 106 also includes circuit board seat 118, power supply seat 120, fan seats 122, hard disk drive seats 124, and cable seats 126.

Chassis lid 108 includes top panel 130 and lip 132. Chassis lid 108 may couple with chassis base 106. Chassis lid 108 and chassis base 106 may form an enclosure for circuit board assembly 102 and related components of computer system 100.

In some embodiments, chassis 104 is made of a shock-absorbing material. Chassis 104 may protect circuit board assembly 102 and other components mounted in or on chassis 104 from damage due to shock and vibration, either during operation of the computer system or during shipping of the system. In some embodiments, chassis 104 is at least partially made of a polymeric material. In some embodiments, chassis 104 is an expanded foam material, such as an expanded foam polypropylene. In certain embodiments, only part of a chassis may be made of a shock-absorbing polymer material. For example, chassis body may be made of a shock-absorbing polymer material, and a chassis lid may be made of sheet metal. Moreover, in certain embodiments, a shock-absorbing chassis may include structurally reinforcing members such as ribs, beams, rods, straps, or grids. Reinforcing members may be external (such as an exoskeleton or external shell), internal (such as rods extending through a body of the chassis), or a combination thereof. Portions of a chassis may be produced by various manufacturing processes, including molding, casting, machining, extruding, or cutting. In one embodiment, chassis body 106 and chassis lid 108 are injection molded. Cutouts may be provided in chassis to provide access to components or cable runs, or to accommodate additional components such as heat sinks or heat pipes.

Circuit board assembly 102 includes circuit board 140, processors 142, DIMM slots 144, and I/O connectors 146. Circuit board assembly 102 may include various other semiconductor devices, resistors, and other heat producing components. Circuit board assembly 102, in conjunction with other components in chassis 104 (hard disk drives, power supplies) and/or components external to chassis 104, may operate in conjunction with one another as a computer system. For example, computer system 100 may be a file server.

Figure 3:
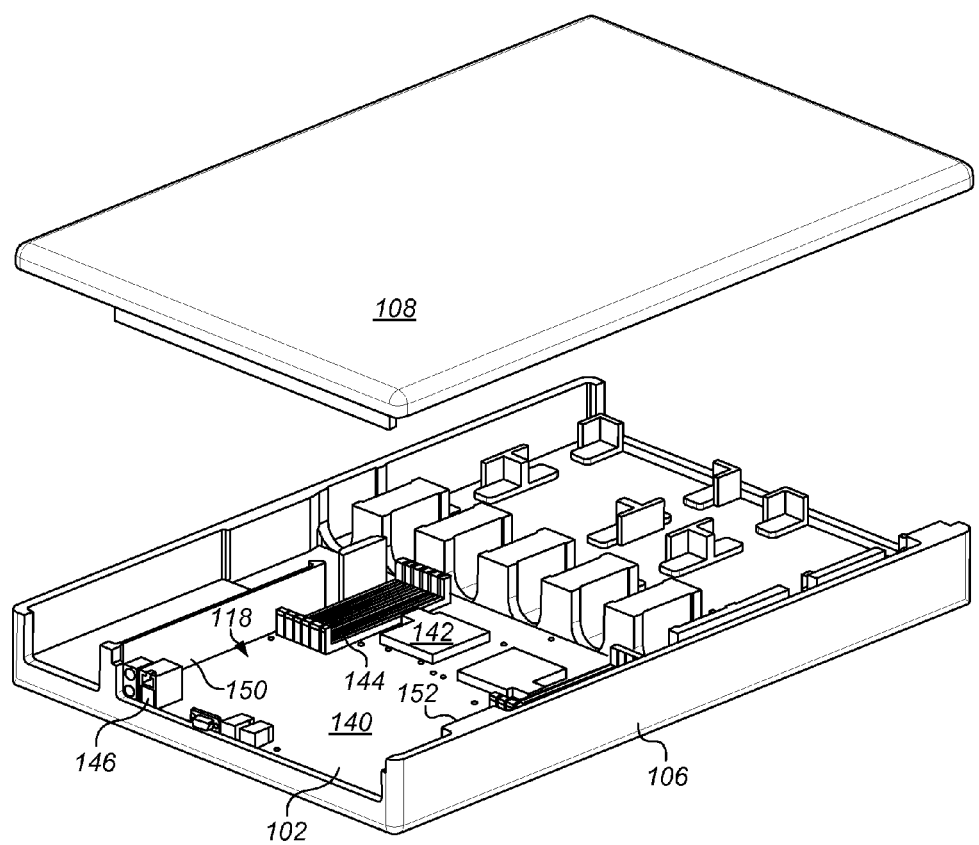
FIG. 3 illustrates a circuit board assembly mounted in a shock-absorbing chassis according to one embodiment.

FIG. 3 illustrates a circuit board assembly mounted in a shock-absorbing chassis according to one embodiment. Circuit board assembly 102 is coupled in circuit board seat 118. In some embodiments, circuit board assembly 102 may couple with chassis base 106 through an interference fit. For example, the width of the gap between left side wall 150 and right side wall 152 shown in FIG. 2 may be slightly less than the width of circuit board 140 of circuit board assembly 102. When circuit board 140 is pressed downward into circuit board seat 118, circuit board 140 may elastically deflect a portion of left side wall 150 and right side wall 152. The deflected side walls may apply a reactive clamping force to the sides of circuit board 140, maintaining circuit board assembly 102 in place in circuit board seat 140. In some embodiments, fasteners, such as screws, may be used to couple a circuit board to a chassis. In still other embodiments, pins attached to a circuit board may be press fit into corresponding holes on a chassis.

In some embodiments, chassis lid 108 may couple with chassis base 106 through an interference fit.

Figure 4:
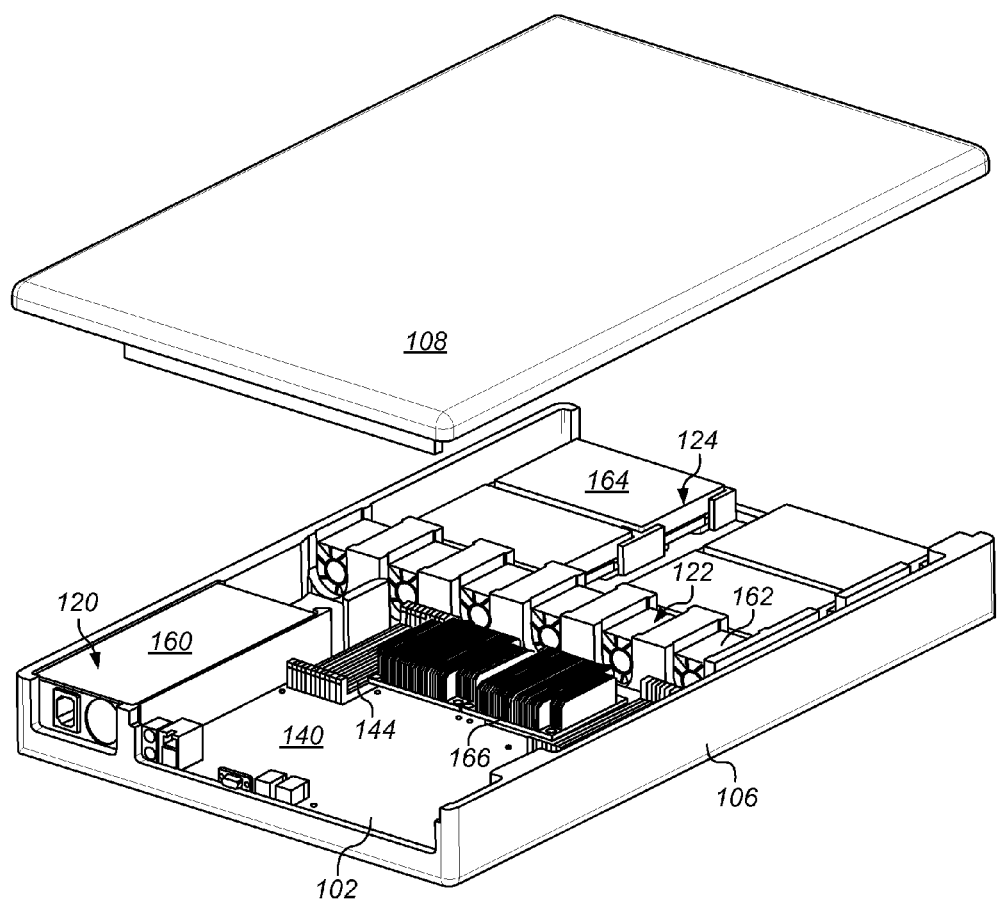
FIG. 4 illustrates a computer system including a chassis supporting a motherboard.

FIG. 4 illustrates a computer system including a chassis supporting a motherboard. Power supply 160 is coupled to chassis base 106 in power supply seat 120. Fans 162 are coupled to chassis base 106 in fan seats 122. Hard disk drives 164 are coupled to chassis base 106 in hard disk drive seats 124. Computer system includes cables (not shown for clarity) to connect various components of computer system 100. Any or all of the components seated in chassis base 106 may be coupled through an interference fit, similar to that described relative to FIG. 3 for circuit board assembly 102.

In the embodiment shown in FIG. 4, computer system 100 includes 6 fans and 4 hard disk drives. A computer system may, however, have any number of fans, hard disk drives, or other components. In certain embodiments, a computer system may have no fans and/or no disk drives. In certain embodiments, a power supply may be external to a computer system. For example, in certain embodiments, circuit board assembly 102 may receive power from a power supply external to computer system 100 (such as a rack-level power supply), and power supply 160 may be omitted.

Heat sinks 166 are mounted on processors 142 (shown in FIG. 2). Heat sinks may transfer heat from processors 142 to air inside chassis 104 during operation of computer system 100. DIMMs (not shown for clarity) may be installed in any or all of DIMM slots 144.

In various embodiments, air may be passed through computer system 100 over heat producing components of the system. Referring again to FIG. 1, chassis 104 includes front opening 170 and rear opening 172. In some embodiments, surfaces of a chassis, such channel, openings, or vanes, may be formed so as to direct, channel, control, or increase the flow of air to desired locations of a system, such as high heat density regions or hot spots on a circuit board assembly. In one embodiment, fans 162 may operate to draw air in through opening 170 and across heat producing components on circuit board 140 and heat sinks 166 on processors 142. Fans 162 may force air over hard disk drives 164 and out of chassis 104 through rear opening 172. Thus, opening 170 may serve as an air inlet and opening 172 may serve as an air exit. In another embodiment, the direction of air flow may be reversed such that the flow is from back to front instead of front to back. In some embodiments, internal fans may be omitted from a computer system and air flow a chassis may be generated by a rack-level cooling air system, or by a cooling air system outside of the rack.

In some embodiments, a chassis includes cutouts, holes, apertures, or other openings to allow space for, or access to, components and assemblies mounted on a circuit board, and/or to accommodate cable runs.

Computer system 100 may be rack-mountable. For example, rails may be installed on the left and right sides of chassis 104 to engage on corresponding rails, slides, or ledges, on left and right sides of a rack. In certain embodiments, a rail kit may be installed on the sides of a chassis.

Figure 5:
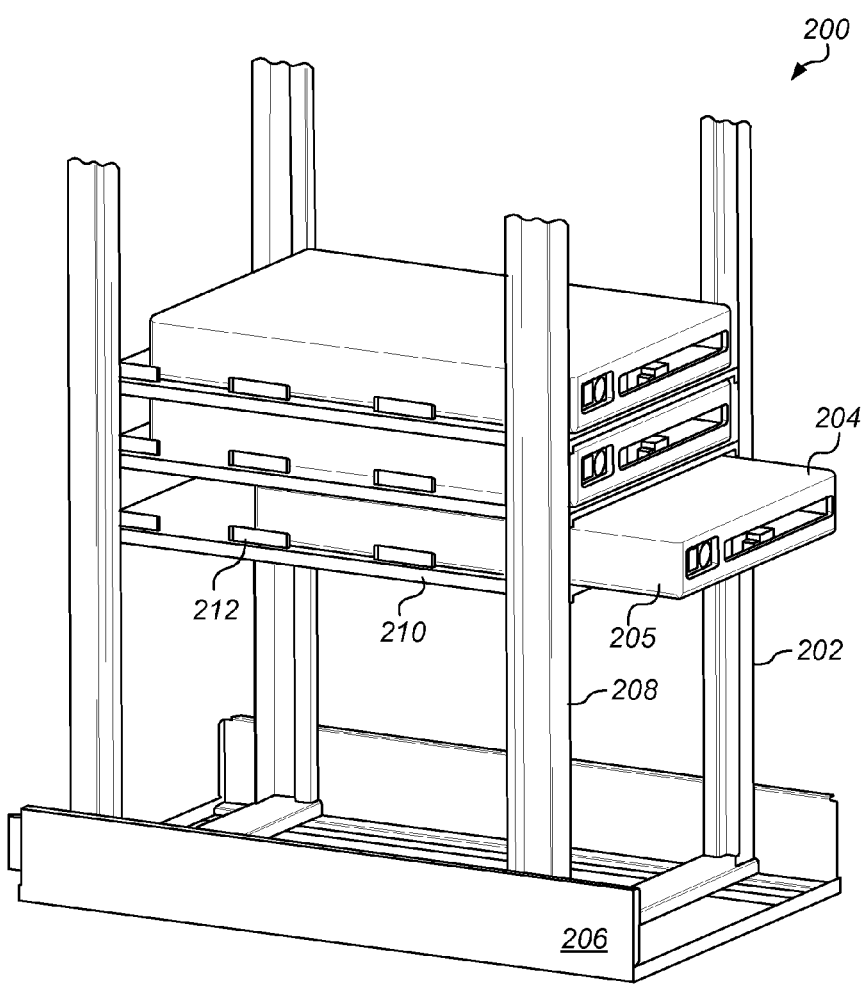
FIG. 5 illustrates a system including multiple computer systems mounted in a rack according to one embodiment.

In some embodiments, a computer system having shock-absorbing chassis is rack-mountable by resting the computer system on a shelf, rails, or other structural element of a rack. FIG. 5 illustrates a system including multiple computer systems mounted in a rack according to one embodiment. System 200 includes rack 202 and computer systems 100. Computer systems may be, for example, file servers in a data center. Chassis 205 may be similar in construction to the chassis described above relative to FIGS. 1-4.

Rack 202 includes base 206, posts 208, and shelves 210. Posts 208 may extend vertically from base 206. Shelves 210 may be supported on posts 208. In some embodiments, a height of shelves 210 may be independently adjustable. For example, each of shelves 210 may couple in rack 202 by movable hangers that connect to posts 208. Adjustable shelves may allow a rack to accommodate different computer systems having different heights.

Computer systems 204 may be slid in and out of rack 202. Each computer system 204 may rest on one of shelves 210 of rack 202. In FIG. 5, the lowest of the three computer system 202 is shown in a partially withdrawn position from rack 202. Shelves 210 include guides 212. Guides 212 may guide computer systems 100 as computer systems 100 are installed or removed from rack 202.

System 200 may include a cooling air system to cool computer systems 204. The cooling air system may cause air to flow through inlet 170 and over heat producing components in chassis.

Figure 6:
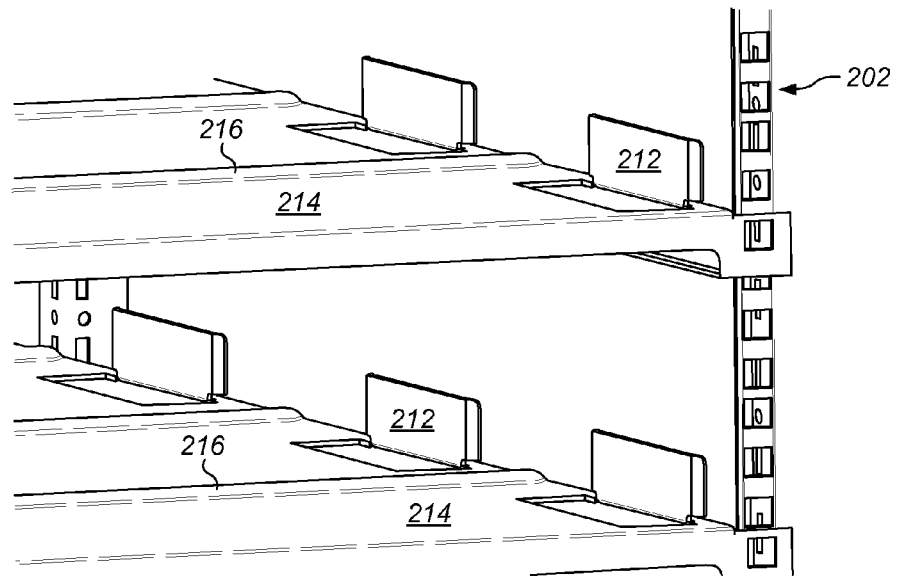
FIG. 6 illustrates a detail view of a shelf including positioning guides according to one embodiment.
Figure 7:
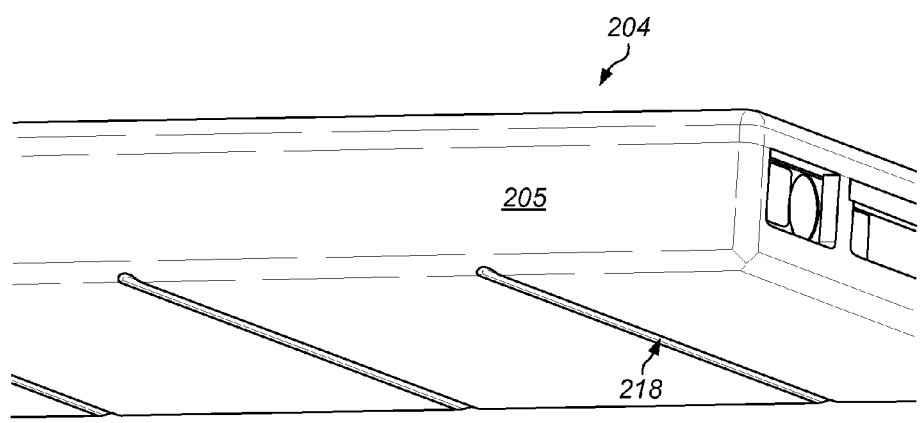
FIG. 7 illustrates a computer system having a chassis with positioning ridges according to one embodiment.

In some embodiments, the chassis for computer systems and a rack system include complementary features to position, guide or align the computer systems in the rack. FIG. 6 illustrates a detail view of a shelf including positioning ridges according to one embodiment. FIG. 7 illustrates a computer system having a chassis with positioning ridges according to one embodiment. Shelf 210 includes base plate 214 and guides 212. In the embodiment show in FIG. 6, guides 212 are punched out from the sheet metal for base plate 214. In other embodiments, however, guides may be separate parts, such as an angle bolted or soldered to a base plate. Base plate 214 includes lateral ridges 216. Lateral ridges 216 may be stamped in base plate 214.

The bottom of chassis 205 includes lateral grooves 218. As computer system 204 is inserted into rack 202 on shelf 210, the sides of computer system 204 may engage guides 212. Guides 212 may guide computer system 204 to remain square with rack 202. The bottom surface of the chassis of computer system 204 may slide over lateral ridges 216. As computer system 204 reaches a fully installed position, lateral grooves on chassis 202 may align with lateral ridges 216, such that lateral ridges 216 may engage on and/or align with lateral grooves 218.

Figure 8:
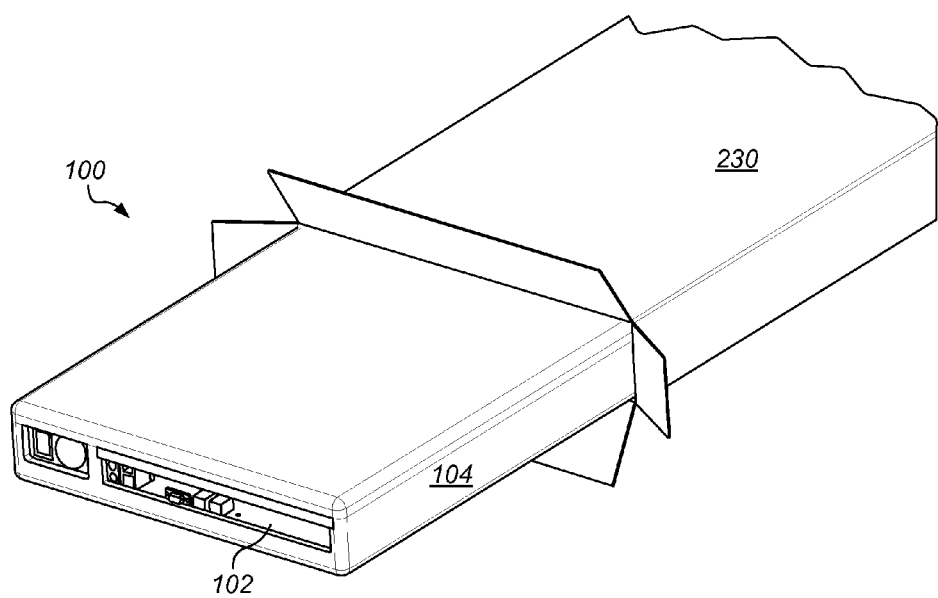
FIG. 8 illustrates a packing arrangement for a computer system that includes a shock-absorbing chassis according to one embodiment.

In some embodiments, a shock-absorbing chassis protects components from damage due to shock and/or vibration during shipping. FIG. 8 illustrates a packing arrangement for a computer system that includes a shock-absorbing chassis according to one embodiment. Computer system 100 includes circuit board assembly 102 and chassis 104. Computer system 100 is shipped in shipping box 230. The internal dimensions of shipping box 230 and the external dimensions of chassis 104 may be chosen such that chassis 104 fits snugly in shipping box 230. In various embodiments, chassis 104 may be made (at least partially) from shock-absorbing materials. Suitable materials may be as described above relative to FIGS. 1-4.

Figure 9:
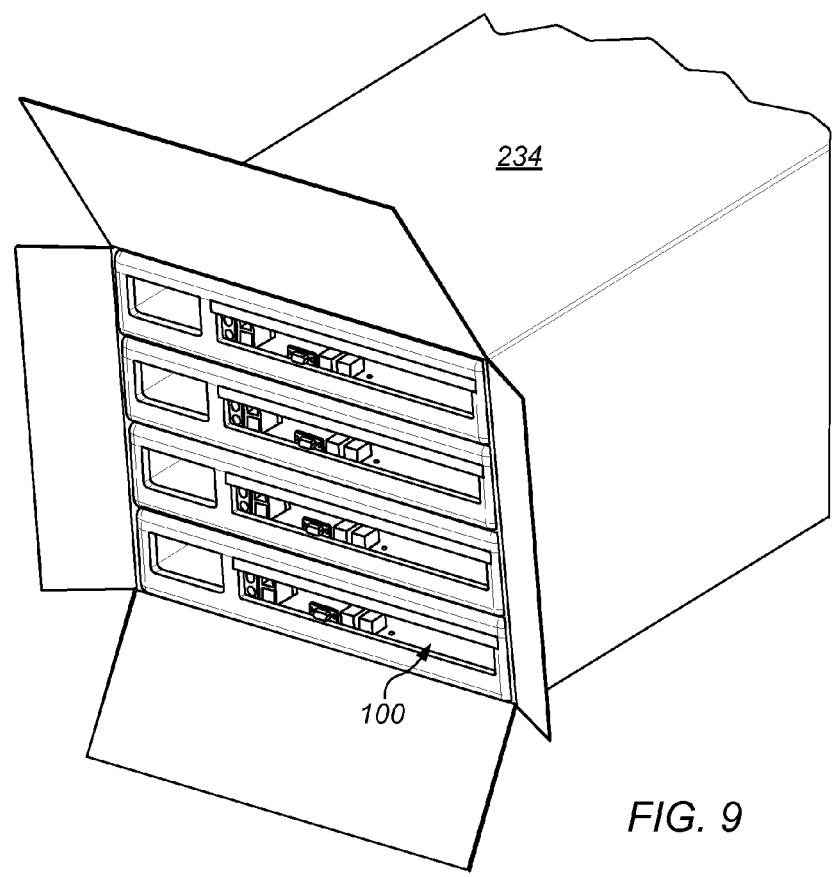
FIG. 9 illustrates a four-pack container for computer systems with shock-absorbing chassis according to one embodiment.

In certain embodiments, computer systems may be shipped in multi-pack containers. FIG. 9 illustrates a four-pack container for computer systems with shock-absorbing chassis according to one embodiment. Computer systems 100 may be stacked directly, one on top of another. The stack of computer systems 100 may fit snugly within shipping box 234. In certain embodiments, two or more computers from a stack may be removed from a multi-pack and installed, as a cluster, into a rack system. In other embodiments, each computer system in a multipack may be installed into a rack separately from the other computer systems in the multipack.

Although FIG. 9 shows a four-pack container of computer systems in shock-absorbing chassis, a container may include any number of such computer systems.

Figure 10:
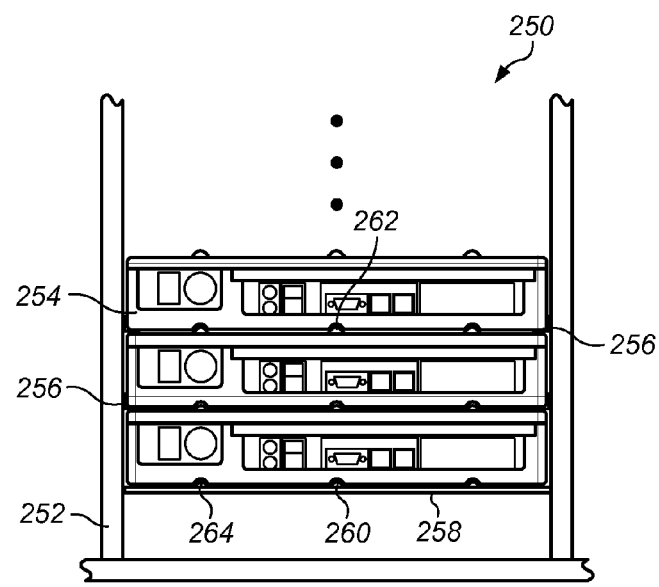
FIG. 10 illustrates an embodiment a rack system in which computer systems are stacked one on another.

In some embodiments, rack-mounted computer systems having shock absorbing chassis may couple with other in a rack. FIG. 10 illustrates an embodiment a rack system in which computer systems are stacked one on another. System 250 includes rack 252 and computer systems 254. Rack 252 includes side rails 256, one on either side of the rack. Rack 252 also includes base plate 258. Computer systems 254 are stacked, one on another, in rack 252. Each computer system 254 may be supported at its left and right edges by a pair of side rails 256.

Each computer system 254 includes grooves 260 on the bottom of the computer system and ridges 262 on the top of the computer system. Grooves 260 and ridges 262 may run from front to back of computer system 254. Grooves 260 and ridges 262 may be parallel to the sides of the computer system. When computer systems 254 are installed in rack, grooves 260 may engage on ridges 262. Ridges 262 on one computer system 254 may provide support for computer systems installed above it in a rack. For example, ridges 262 of one computer system 252 may support the computer system 252 immediately above it midway between side rails 256, for example, to prevent sag in the computer system between the side rails. In some embodiments, engagement of grooves 260 on ridges 262 may help align computer systems 254 with one another or a rack. Similarly ridges 264 on base plate 258 of rack may align and/or support the lowermost computer system 252 in the rack.

In certain embodiments, side rails 256 may be omitted, and a computer system 254 may be fully supported by the computer systems 252 below it in the rack (such as on ridges 262). In certain embodiments, ridges 262 may couple in grooves 260 in an interference fit. In other embodiments, grooves 260 on ridges 262 may be omitted.

FIG. 11 illustrates a portion of a rack system including computer systems with shock-absorbing chassis in which the computer systems are arranged in a vertical orientation. System 280 includes rack 282, tray 284, and computer systems 286. Tray 284 is mounted in rack 282. Computer systems 286 a mounted vertically on tray 284. In some embodiments, air may be passed through rack 282 to cool computer systems 286. In certain embodiments, a computer system with a shock-absorbing chassis may be a blade server.

In certain embodiments, a chassis may be formed, at least in part, of an electrically conductive polymeric material. In certain embodiments, surfaces of a polymeric chassis may be coated with an electrically conductive material. For example, the exterior surfaces of chassis bottom 106 and chassis lid 108 shown in FIGS. 1 and 2 may have an electrically conductive coating. An electrically conductive polymeric material of a chassis, or coating on a chassis, may provide EMI shielding for active components in the computer system. In certain embodiments, electrically conductive base material or coating may form, alone or in combination with other elements such as EMI gaskets, an EMI enclosure for components in the computer system. In some embodiments the electrically conductive polymeric base material or coating may contact one or more electrically conductive grounding pads of one or more circuit boards within the chassis. The grounding pads may conductively connect to a ground plane of the circuit board(s) which in turn may be grounded through a power supply or power connection for the computer system.

In some embodiments, a combination of portions of neighboring chassis in a rack may combine to form an enclosure around one or more circuit board assemblies of a computer system. In some embodiments, the enclosure may provide EMI shielding for components in the computer system. FIG. 12A illustrates a schematic end view of a system including shock absorbing chassis forming an enclosure according to one embodiment. FIG. 12B illustrates a schematic side view of the system shown in FIG. 12A. System 300 includes rack 302 and computer systems 304. Computer systems 304 include circuit board assembly 306, chassis 308, I/O connectors 310, power supply 312, and hard disk drives 314. Chassis 308 includes front panel 316, side panels 318, and rear panel 320. Front panel 316 includes air inlet 322.

Front panel 316, side panels 318, rear panel 320 of each computer system 304 may extend upwardly to near the bottom of circuit board chassis 308 of the computer system immediately above it in rack 302. For a given computer system 304, front panel 316, side panels 318, rear panel 320, in combination with the bottom portion of the next-higher chassis 308, may combine to form an enclosure around components of circuit board assembly 306.

FIG. 13 illustrates a side view of a rack system that holds computer systems in a slanted orientation according to one embodiment. System 340 includes rack 342 and computer systems 344. Computer systems 344 may be shock absorbing chassis similar to those described above relative to FIGS. 1-4 and 7. Rack 342 includes rails 346. Rails 346 may slant upward from front to back of rack 342. Air may flow through in through front of rack 342, through computer systems 344, and exit at the rear of rack 342. Upward slant of computer systems 344 may promote airflow through computer systems 342. In some embodiments, a slanted orientation of a computer system in a rack complements the natural buoyancy of the air heated over components of a circuit board assembly in the computer system, and thus may promote flow and increase effectiveness of cooling of the computer system.

Figure 14:
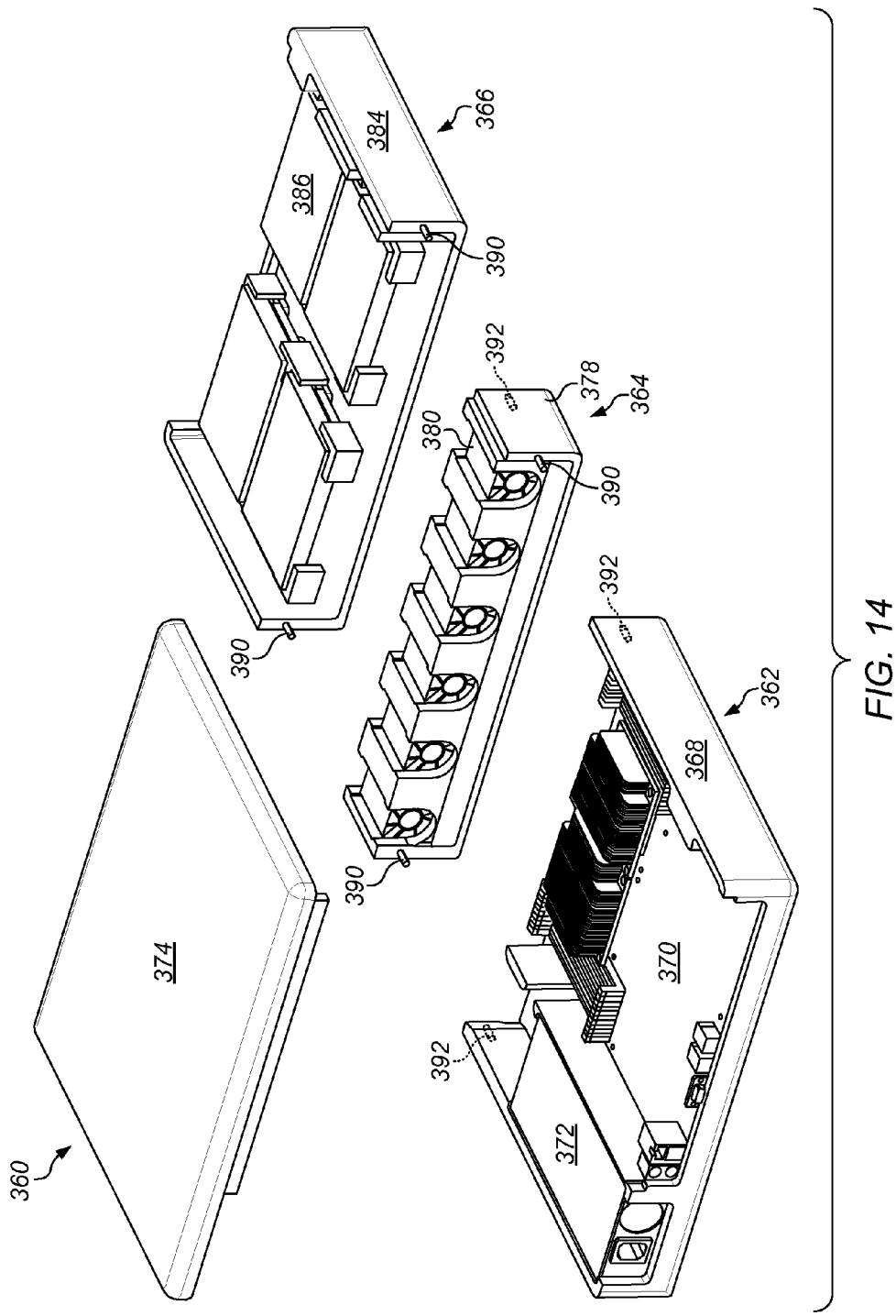
FIG. 14 illustrates a computer system including multiple chassis modules according one embodiment.

In some embodiments, a computer system may include two or more shock-absorbing chassis that are coupled to one another or two or more shock-absorbing chassis modules. Each chassis or chassis module may support one or more components of the computer system. For example, one chassis or chassis module may support a motherboard assembly and another one chassis or chassis module may support hard disk drives. FIG. 14 illustrates a computer system including multiple chassis modules according one embodiment. Computer system 360 includes motherboard module 362, fan module 364, and hard disk drive module 366. Motherboard module 362 may include motherboard chassis module 368, motherboard 370, power supply 372, and chassis lid 374. Fan module 376 includes fan chassis module 378 and fans 380. Hard disk drive module 382 includes hard disk drive chassis module 384 and hard disk drives 386.

In some embodiments, two or more modules couple with one another to form a computer system. The chassis modules may be made of a polymeric material. In certain embodiments, adjacent chassis modules have interlocking features to couple the modules to one another. For example, coupling portions of adjoining polymeric chassis may have interlocking grooves, channels, ridges, lips, buttons, sockets, or the like.

In the embodiment shown in FIG. 14, motherboard chassis module 368 may couple with fan chassis module 378. Fan chassis module 378 may couple with hard disk drive chassis module 384. Chassis modules may couple to one another by way of pins 390 and corresponding holes 392. In some embodiments, pins 392 couple with holes 392 by way of a friction fit.

Figure 15:
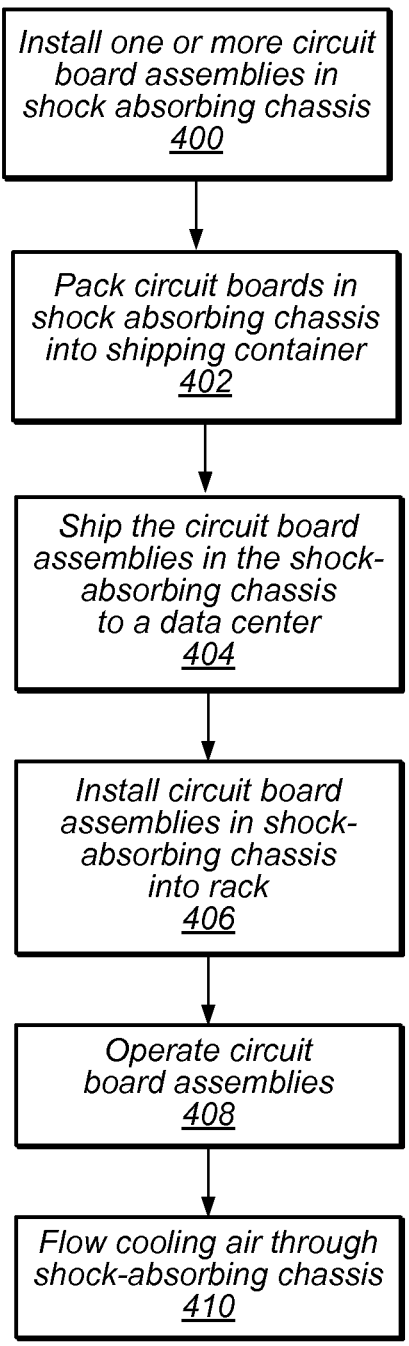
FIG. 15 illustrates one embodiment of providing computer systems with shock-absorbing chassis.

In some embodiments, a circuit board assembly, such as the motherboard of a server, is shipped to a data center in a shock-absorbing chassis that can be used to rack-mount the circuit board assembly. In some embodiments, a computer system including a motherboard and other components of a computer system (such as power supplies and hard disk drives) is shipped in a shock-absorbing chassis and the shock-absorbing chassis is installed in the rack. FIG. 15 illustrates one embodiment of providing computer systems with shock-absorbing chassis. At 400, a circuit board assembly is installed in a shock-absorbing chassis. The chassis may be made of a shock-absorbing material. The shock-absorbing material may be, for example, an expanded foam polymeric material. In some embodiments, other components of the system, such as a power supply, fans, or hard disk drives may also be installed on the chassis. In certain embodiments, some components may not be installed in the chassis until the chassis reaches a data center. In one embodiment, one or more heat sinks may not be installed on a heat producing component on a circuit board in the chassis until the chassis reaches a data center.

At 402, the shock-absorbing chassis carrying the circuit board assembly is packed into a shipping container. In some embodiments, two or more shock-absorbing chassis may be placed in one shipping container. At 404, the circuit board assembly is shipped in the shock-absorbing chassis to a data center. The shock-absorbing chassis may protect the circuit board assembly from damage from shock or vibration during shipping. The shock-absorbing chassis may eliminate the need for dedicated packing materials, such as polystyrene foam packing blocks, for shipping of the circuit board.

At 406, the shock-absorbing chassis carrying the circuit board assemblies are installed in a rack at the data center. If any of the components, such as hard disk drives, were not installed in the chassis when it was shipped, the components may be installed at the data center before inserting the chassis into the rack. In one embodiment, one or more heat sinks are installed on heat producing components of a circuit board assembly.

In some embodiments, two or more circuit board assemblies, each in a different shock absorbing chassis, are installed in a rack. In certain embodiments, shock-absorbing chassis for the two or more circuit board assemblies are stacked on top of one another, such as described above relative to FIG. 10. In certain embodiments, two or more chassis from a multi-pack, such as described above relative to FIG. 9, are installed together into a rack.

At 408, a computer system including the circuit board assembly and the chassis are placed into operation. At 410, air is passed through the chassis of the computer systems to cool components in the computer systems.

In certain embodiments, two or more modules of a computer system are separately shipped to a data center. Each of the modules may include a separate chassis module. The chassis modules may be coupled with one another at the data center before installation into a rack. For example, for computer system 360 shown in FIG. 14, motherboard module 362, fan module 364, and hard disk drive module 366 may each be shipped separately from one another to a data center. The chassis modules for each of motherboard module 362, fan module 364, and hard disk drive module 366 may protect the components of the modules from damage due to loads encountered during shipping. At the data center, motherboard module 362, fan module 364, and hard disk drive module 366, then installed in a rack as a unit.

Although the embodiments described above have been discussed largely in the context of rack-mounted systems, a shock-absorbing and/or polymeric chassis may, in various embodiments, be included in other systems, including stand-alone devices such as set top boxes, personal computing systems, and portable electronic devices. In certain embodiments, a single chassis may provide support for, two or more circuit board assemblies.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
a rack;
one or more computer systems mounted in the rack, wherein at least one of the computer systems comprises:
a circuit board assembly;
a power supply unit;
one or more hard disk drives; and
a chassis coupled to the circuit board assembly, the power supply unit, and the one or more hard disk drives, wherein at least a portion of the chassis is made of a shock-absorbing polymeric material configured to protect the circuit board assembly, the power supply unit, and the one or more hard disk drives from damage from shock or vibration,
wherein the chassis comprises a top shock-absorbing polymeric portion and a bottom shock-absorbing polymeric portion, wherein the at least one computer system comprises:
a first air passage between the top shock-absorbing polymeric portion and the bottom shock-absorbing polymeric portion, wherein the first air passage comprises an air inlet in the chassis at the front side of the rack and an air exit in the chassis at the back side on the rack, wherein the first air passage between the top shock-absorbing polymeric portion and the bottom shock-absorbing polymeric portion is configured to allow air to move through the chassis from front to back, wherein the air moves across the circuit board assembly such that the air removes heat from heat producing components on the circuit board assembly,
a second air passage comprises an air inlet in the chassis at the front side of the rack, wherein the second air passage configured to allow air to move through the chassis from front to back, wherein air in the second passage moves across the heat producing components in the power supply unit such that the air removes heat from the power supply unit, and
a third air passage downstream from the first air passage and the second air passage, wherein the third air passage is configured to allow air downstream from the circuit board assembly and the power supply unit to move across heat producing components of at least one of the one or more hard disk drives such that the air removes heat from the at least one hard disk drive.

2. The system of claim 1, wherein at least a portion of the shock-absorbing polymeric material is an expanded foam material.

3. The system of claim 1, wherein, for at least one of the computer systems, the circuit board assembly is coupled to the chassis through an interference fit, wherein the coupling portion of the chassis for the interference fit comprises polymeric material.

4. The system of claim 1, wherein the power supply unit is configured to supply power to components of the circuit board assembly, wherein the shock-absorbing polymeric material is configured to protect the circuit board assembly from damage from shock or vibration.

5. The system of claim 1, wherein the shock absorbing polymeric material is configured to protect at least one of the one or more hard disk drives from damage from shock or vibration.

6. The system of claim 1, wherein the rack comprises at least one shelf, wherein the at least one of the computer systems is mounted to the rack by resting the chassis of the computer system resting on the shelf.

7. The system of claim 1, wherein the rack comprises at least one pair of opposing rails, wherein the at least one of the computer systems is mounted to the rack by resting the chassis of the computer system on the pair of rails.

8. The system of claim 1, wherein at least one of the one or more computer systems and the rack comprise complementary mating surfaces, wherein the complementary mating surfaces are configured to align or position the at least one computer system in rack.

9. The system of claim 1, wherein the one or more computer systems comprises two or more computer systems.

10. The system of claim 9, wherein the shock-absorbing polymeric material of at least one of the computer systems in the rack supports at least one other of the computer systems within a stack of computer systems in the rack.

11. The system of claim 9, wherein at least one of the computer systems comprising the chassis at least partially made of shock-absorbing polymeric material is supported by a chassis of at least one other of the computer systems.

12. The system of claim 9, wherein at least one of the computer systems comprising the chassis at least partially made of shock-absorbing polymeric material is stacked on, and supported by, at least one other of the computer systems.

13. The system of claim 1, wherein at least one motherboard assembly in at least one of the computer systems is in a horizontal orientation in the rack.

14. The system of claim 1, wherein at least one motherboard assembly in at least one of the computer systems is in a vertical orientation in the rack.

15. The system of claim 1, wherein at least one of the one or more computer systems comprises one or more passages formed in the chassis, wherein at least one of the passages is configured to allow air to pass over heat producing components of the circuit board assembly to cool the heat producing components.

16. The system of claim 15, further comprising a cooling air system configured to pass air through at least one of the passages of the at least one computer system.

17. The system of claim 16, wherein at least one of the one or more computer systems is mounted in the rack at an upward slant, such that at least one air exit out of the passage for the at least one computer system is higher than at least one air inlet to the passage.

18. The system of claim 1, wherein the chassis comprises one or more structural member coupled the shock absorbing polymeric material of the chassis, wherein at least one of the structural members is configured to reinforce the shock absorbing polymeric material.

19. The system of claim 1, wherein the chassis of at least one of the one or more computer systems is at least partially made of an electrically conductive polymeric material, wherein the chassis is configured to form at least a partial EMI enclosure for the circuit board assembly.

20. The system of claim 1, wherein the chassis of at least one of the one or more computer systems comprises an electrical conductive coating on at least a portion of the shock absorbing polymeric material of the chassis.

21. The system of claim 1, wherein the one or more computer systems comprise:
    a first computer system comprising a first circuit board assembly and a first chassis coupled to the first circuit board assembly;
    a second computer system mounted below the first computer system, the second computer system comprising a second circuit board assembly and a second chassis coupled to the second circuit board assembly.

22. The system of claim 21, wherein the first chassis of the first computer system and the second chassis of the second computer system combine to form at least a partial EMI enclosure for components of the second circuit board assembly.

23. A computer system, comprising:
    a first computer system module comprising:
        a first chassis module; and
        one or more circuit board assemblies coupled to the first chassis module;
    one or more additional computer system modules separate from the first computer system module and comprising:
        one or more additional chassis modules coupled to the first chassis module; and
        at least one component coupled to at least one of the one or more additional chassis module and configured to be electrically coupled to at least one of the circuit board assemblies;
    wherein the first chassis module comprises a shock-absorbing polymeric portion configured to protect the circuit board assembly from damage from shock or vibration;
    wherein at least one of the additional chassis modules comprises another shock-absorbing polymeric portion separate from the shock-absorbing polymeric portion of the first chassis module and configured to protect the at least one component, separately from the first chassis module protecting the circuit board assembly, from damage from shock or vibration, such that the at least one of the additional chassis modules is configured to be shipped with the at least one component separately from the first chassis module being shipped with the one or more circuit board assemblies; and
    wherein the shock-absorbing polymeric portion of the first chassis module and the shock-absorbing polymeric portion of the at least one additional chassis module are configured to couple with one another prior to installation into a rack such that the at least one of the circuit board assemblies and the at least one component are electrically coupled and the first chassis module and the at least one additional chassis module are installable into the rack as a unit.

24. The computer system of claim 23, wherein the first chassis module and at least one of the one or more additional chassis modules is at least partially made of an expanded polymeric material configured to protect the circuit board assembly from damage from shock or vibration.

25. The computer system of claim 23, wherein the first chassis module and the at least one of the additional chassis modules are coupled through an interference fit, wherein at least one of the coupling portions for the interference fit comprises polymeric material.

26. The computer system of claim 23, wherein the one or more additional chassis modules comprise a second chassis module, wherein the at least one component coupled to the at least one additional chassis module comprises one or more fans coupled to the second chassis module.

27. The computer system of claim 23, wherein the one or more additional chassis modules comprise a second chassis module, wherein the at least one component coupled to the at least one additional chassis module comprises one or more hard disk drives coupled to the second chassis module.

28. The computer system of claim 23, wherein the one or more additional chassis modules comprise a second chassis module and a third chassis module, wherein the at least one component coupled to the at least one additional chassis module comprises one or more fans coupled to the second chassis module and one or more hard disk drives coupled to the third chassis module.

29. The computer system of claim 23, further comprising a power supply unit coupled to at least one of the chassis modules.

30. A method of providing computing resources, comprising:
    coupling one or more circuit board assemblies with one or more shock-absorbing chassis comprising a polymeric shock-absorbing portion, wherein the shock-absorbing chassis are configured to protect the circuit board assemblies from damage from shock or vibration;
    shipping the one or more circuit board assemblies in the one or more shock-absorbing chassis to a data center;
    coupling at least one component with one or more additional shock-absorbing chassis comprising a shock-absorbing polymeric portion, wherein the one or more shock-absorbing chassis are configured to protect the at least one component from damage from shock or vibration;
    shipping, separately from the one or more circuit board assemblies in the one or more shock absorbing chassis, the at least one additional component with the one or more additional shock-absorbing chassis to the data center;
    before installing the one or more shock-absorbing chassis coupled with the one or more circuit board assemblies into the rack, coupling, at the data center, the shock-absorbing polymeric portion of at least one of the one or more additional shock-absorbing chassis that is coupled with the additional component to the shock-absorbing polymeric portion of at least one of the one or more shock-absorbing chassis that is coupled with the one or more circuit board assemblies, wherein the shock-absorbing polymeric portion of the at least one shock-absorbing chassis and the shock-absorbing polymeric portion of the at least one additional shock-absorbing chassis couple with one another such that the at least one shock-absorbing chassis and the at least one additional shock absorbing chassis are installable into a rack as a unit, and electrically coupling the at least one additional component to at least one of the circuit board assemblies; and
    installing into the rack, as a unit, the coupled one or more circuit board assemblies with the one or more shock-absorbing chassis and the additional shock-absorbing chassis.

31. The method of claim 30, wherein the shock-absorbing material comprises a polymer.

32. The method of claim 30, wherein the shock-absorbing material comprises an expanded foam material.

33. The method of claim 30, wherein installing the one or more circuit board assemblies with the shock-absorbing chassis into the rack comprises stacking at least one shock-absorbing chassis that carries at least one circuit board assembly onto at least one other shock-absorbing chassis that carries at least one other circuit board assembly.

34. The method of claim 30, further comprising operating the circuit board assembly to perform computing operations.

35. The method of claim 34, further comprising flowing air through at least one air passage in at least one shock-absorbing chassis in the rack.

36. The method of claim 30, further comprising, before installing at least one of the one or more shock-absorbing chassis coupled with the one or more circuit board assemblies into the rack:
    installing, at the data center, at least one hard disk drive in the at least one shock-absorbing chassis; and
    electrically coupling, at the data center, the at least one hard disk drive at least one of the circuit board assemblies in the chassis.

37. The method of claim 30, further comprising, before installing at least one of the one or more shock-absorbing chassis coupled with the one or more circuit board assemblies into the rack:
    installing, at the data center, at least one power supply in the at least one shock-absorbing chassis; and
    electrically coupling, at the data center, the at least one power supply at least one of the circuit board assemblies in the chassis.

38. The method of claim 30, wherein the at least one additional component comprises one or more hard disk drives.

39. The method of claim 30, wherein the at least one additional component comprises one or more fans.

40. The method of claim 30, wherein at least one of the one or more additional shock-absorbing chassis is coupled to the one shock-absorbing chassis through an interference fit, wherein at least one of the coupling portions for the interference fit comprises polymeric material.

* * * * *